United States Patent
Hin et al.

(10) Patent No.: US 9,425,174 B1
(45) Date of Patent: Aug. 23, 2016

(54) INTEGRATED CIRCUIT PACKAGE WITH SOLDERLESS INTERCONNECTION STRUCTURE

(71) Applicant: Altera Corporation, San Jose, CA (US)

(72) Inventors: Tze Yang Hin, Batu Maung (MY); Loon Kwang Tan, Kepala Batas (MY); Chew Ching Lim, Sungai Petani (MY)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 14/546,296

(22) Filed: Nov. 18, 2014

(51) Int. Cl.
*H01L 25/10* (2006.01)
*H01L 23/00* (2006.01)
*H01L 21/56* (2006.01)
*H01L 25/00* (2006.01)
*H01L 21/768* (2006.01)
*H01L 23/528* (2006.01)
*H01L 23/31* (2006.01)

(52) U.S. Cl.
CPC ............ *H01L 25/105* (2013.01); *H01L 21/563* (2013.01); *H01L 21/768* (2013.01); *H01L 23/3142* (2013.01); *H01L 23/528* (2013.01); *H01L 24/11* (2013.01); *H01L 24/16* (2013.01); *H01L 24/17* (2013.01); *H01L 24/81* (2013.01); *H01L 25/50* (2013.01); *H01L 2224/13147* (2013.01); *H01L 2224/16057* (2013.01); *H01L 2224/16227* (2013.01); *H01L 2224/81203* (2013.01); *H01L 2224/81801* (2013.01); *H01L 2924/1304* (2013.01); *H01L 2924/14* (2013.01)

(58) Field of Classification Search
CPC ......... H01L 24/17; H01L 24/81; H01L 24/16; H01L 24/12; H05K 2201/10515; H05K 2201/10674; H05K 2201/1053
See application file for complete search history.

(56) References Cited

U.S. PATENT DOCUMENTS

| | | | |
|---|---|---|---|
| 5,677,203 A * | 10/1997 | Rates | 438/15 |
| 6,201,305 B1 * | 3/2001 | Darveaux et al. | 257/779 |
| 6,245,594 B1 * | 6/2001 | Wu et al. | 438/108 |
| 6,271,059 B1 | 8/2001 | Bertin et al. | |
| 6,380,555 B1 * | 4/2002 | Hembree et al. | 257/48 |
| 6,396,156 B1 * | 5/2002 | Tang | H01L 24/11 257/778 |
| 6,410,988 B1 * | 6/2002 | Caletka et al. | 257/778 |
| 7,112,524 B2 * | 9/2006 | Hsu | H01L 24/11 257/E21.508 |
| 7,241,675 B2 | 7/2007 | Savastiouk et al. | |
| 7,592,702 B2 * | 9/2009 | Lewis et al. | 257/773 |
| 8,237,273 B2 * | 8/2012 | Hsu et al. | 257/737 |
| 8,558,369 B2 | 10/2013 | Camacho et al. | |
| 8,598,715 B2 * | 12/2013 | Chen | 257/774 |
| 8,803,333 B2 | 8/2014 | Yu et al. | |
| 2004/0089936 A1 * | 5/2004 | Shizuno | 257/686 |
| 2006/0076661 A1 | 4/2006 | Savastiouk et al. | |
| 2008/0296761 A1 * | 12/2008 | Lee et al. | 257/737 |
| 2010/0148374 A1 * | 6/2010 | Castro | H01L 24/11 257/778 |
| 2010/0169158 A1 * | 7/2010 | Agarwal | G06K 9/6226 705/7.11 |

(Continued)

*Primary Examiner* — Alonzo Chambliss (57) ABSTRACT

An integrated circuit package may include an integrated circuit die and a package substrate having a conductive pad. A conductive pillar is formed on a front surface of the integrated circuit die and directly contacts the conductive pad. Prior to contacting the conductive pad directly, the conductive pillar may be positioned adjacent to the conductive pad such that it is aligned to the conductive pad. The integrated circuit package further includes an interconnect structure that is formed in the package substrate. The interconnect structure may include conductive traces that are electrically connected to the conductive pad and the conductive pillar. An additional integrated circuit die may be mounted on the package substrate. The additional integrated circuit die may couple to the integrated circuit die through the interconnect structure.

4 Claims, 5 Drawing Sheets

(56) References Cited

U.S. PATENT DOCUMENTS

| | | | |
|---|---|---|---|
| 2011/0133327 A1* | 6/2011 | Hsu | H01L 21/563 257/692 |
| 2011/0143502 A1* | 6/2011 | Castro | H01L 24/11 438/127 |
| 2011/0215467 A1* | 9/2011 | Hsu et al. | 257/737 |
| 2011/0215476 A1* | 9/2011 | Lee | H01L 24/11 257/762 |
| 2011/0285015 A1* | 11/2011 | Song | H01L 24/03 257/737 |
| 2012/0091576 A1* | 4/2012 | Tsai et al. | 257/737 |
| 2013/0062764 A1* | 3/2013 | Jin | 257/738 |
| 2013/0068514 A1* | 3/2013 | Hsu | H01L 21/563 174/259 |
| 2014/0124922 A1* | 5/2014 | Kim et al. | 257/737 |
| 2014/0299999 A1* | 10/2014 | Hu | H01L 21/56 257/774 |
| 2015/0021767 A1* | 1/2015 | Park | H01L 24/13 257/738 |
| 2015/0162292 A1* | 6/2015 | Machida | H01L 24/16 257/737 |

\* cited by examiner

FIG. 5

INTEGRATED CIRCUIT PACKAGE WITH SOLDERLESS INTERCONNECTION STRUCTURE

BACKGROUND

As the semiconductor industry continues to grow, the need to develop increasingly complex integrated circuits with smaller feature sizes and dimensions has been highly sought after. Driven by the demand for high performance, integrated circuit (IC) devices have been incorporating more circuits per unit area. However, this may also create a significant challenge in creating reliable interconnect structures in order to support device scaling and higher operating speeds for future generations of integrated circuit devices.

Conductive pillars are generally used in small IC packages with relatively high input-output (IO) density. Typically, solder is used to connect the conductive pillars on an IC die to conductive pads on a package substrate. A reflow process can be performed to melt the solder, which forms solder joints between the conductive pillars and conductive pads after the molten solder is cooled. However, problems may also occur when solder is used in the IC packages. For example, it is difficult to prevent the solder from wetting to the sidewalls of the conductive pillars, which may cause bridging between adjacent conductive pillars. To avoid solder wetting, the conductive pillars need to be placed adequately far apart from each other (e.g., at least 50 micrometers apart), which limits the density of an IC package.

For the case of pre-soldered bumps on a package substrate, thermal compression bonding may be performed to attach the conductive pillars on the IC die to the pre-soldered bumps on the package substrate. When the pre-solder bumps fuses together with the adjacent conductive pillars and conductive pads during the thermal compression bonding process, solder bridging may occur when the conductive pillars and pads are too close to one another. This may cause inadvertent shorting of the solder bumps in the IC package.

SUMMARY

In accordance with the present invention, apparatuses and methods are provided for creating an integrated circuit package with a solderless interconnection structure.

It is appreciated that the present invention can be implemented in numerous ways, such as a process, an apparatus, a system, or a device. Several inventive embodiments of the present invention are described below.

An integrated circuit package is provided. The integrated circuit package includes an integrated circuit die and a package substrate having a conductive pad. A conductive pillar is formed on a front surface of the integrated circuit die and directly contacts the conductive pad. Prior to contacting the conductive pad directly, the conductive pillar may be positioned adjacent to the conductive pad such that it is aligned to the conductive pad. The integrated circuit package further includes an interconnect structure that is formed in the package substrate. The interconnect structure may include copper traces that are electrically connected to the conductive pad and the conductive pillar. An additional integrated circuit die may be mounted on the package substrate. The additional integrated circuit die may be coupled to the integrated circuit die through the interconnect structure in the package substrate.

Another integrated circuit package is provided. The integrated circuit package includes a package substrate and an integrated circuit die with front and back surfaces. Multiple conductive pads may be formed on a surface of the package substrate and multiple conductive pillars may be formed on the front surface of the integrated circuit die. Subsequently, the integrated circuit die is mounted on the package substrate, with each conductive pillar making direct physical contact with a corresponding conductive pad of the conductive pads.

A method for fabricating an integrated circuit package is provided. The method includes forming conductive pads on a package substrate and conductive pillars over an integrated circuit die. Each of the conductive pillars makes direct physical contact with a corresponding conductive pad of the conductive pads without any intervening solder. Each of the conductive pillars is aligned to the corresponding conductive pad and attached to each other using heat and compression. The integrated circuit die is assembled on the package substrate to form the integrated circuit package. The method further includes forming interconnect pathways in the package substrate. The interconnect pathways may connect the integrated circuit die to an additional integrated circuit die that is assembled on the package substrate and coupled to the integrated circuit die through the interconnect pathways.

Further features of the invention, its nature and various advantages, will be more apparent from the accompanying drawings and the following detailed description of the preferred embodiments.

DETAILED DESCRIPTION

The embodiments provided herein include integrated circuit structures and packaging techniques for creating an integrated circuit package with a solderless interconnection structure.

It will be obvious, however, to one skilled in the art that the present exemplary embodiments may be practiced without some or all of these specific details described with reference to the respective embodiments. In other instances, well-known operations have not been described in detail in order not to obscure unnecessarily the present embodiments.

Figure 1:
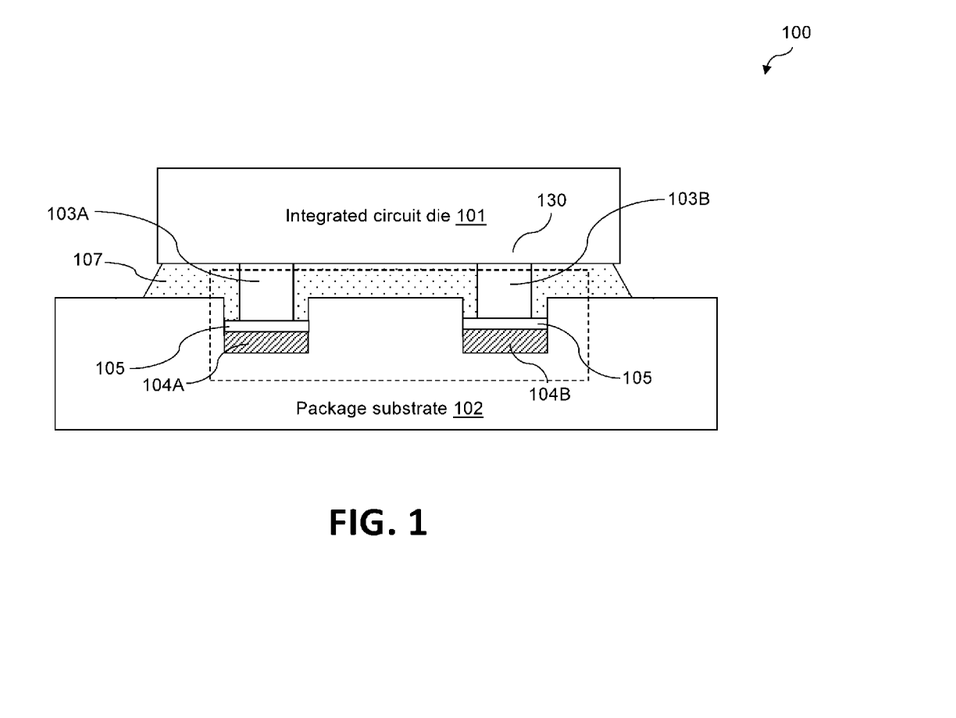
FIG. 1 shows a cross-sectional side view of an illustrative integrated circuit package in accordance with an embodiment of the present invention.

FIG. 1 shows a cross-sectional side view of illustrative integrated circuit package 100, in accordance with an embodiment of the present invention. Integrated circuit package 100 includes integrated circuit die 101 that is mounted on package substrate 102. In one embodiment, integrated circuit die 101 has a front surface that serves as an active surface of integrated circuit die 101 in which transistors (not shown) are formed. Accordingly, one or more conductive pillars (e.g., conductive pillars 103A and 103B) are formed on the front surface of integrated circuit die 101 using a conventional manufacturing method, which will not be described herein.

Conductive pillars 103A and 103B may provide electrical connectivity and joint support between integrated circuit die 101 and package substrate 102. As an example, conductive pillars 103A and 103B may be copper pillars.

As shown in FIG. 1, one or more conductive pads (conductive pads 104A and 104B) may be formed on package substrate 102. A protective layer 105 may be applied on the exposed surfaces of conductive pads 104A and 104B to protect and insulate the conductive pads from oxidation. As an example, protective layer 105 is an organic solderability preservative (OSP) material. A more detailed description of package substrate 102 and conductive pads 104A and 104B, highlighted by region 130, will be described below with reference to FIG. 2.

During die placement, integrated circuit die 101 is aligned such that each of the conductive pillars 103A and 103B is aligned to a corresponding conductive pad on package substrate 102 (i.e., conductive pads 104A and 104B). Non-conductive material 107 (sometimes referred to as "underfill" material) is then applied to package substrate 102, typically by dispensing the non-conductive material in between conductive pillars 103A and 103B. Non-conductive material 107 may serve as an adhesive to reinforce the physical and mechanical properties of conductive pillars 103A and 103B between integrated circuit die 101 and package substrate 102.

Subsequently, integrated circuit die 101 is attached onto package substrate 102 in a flip-chip configuration, with the front surface (e.g., active surface) of integrated circuit die 101 facing package substrate 102. A thermal compression process is performed on the back surface (e.g., inactive surface) of integrated circuit die 101 so that integrated circuit die 101 is mechanically and electrically connected to package substrate 102 by heat and compression. In this scenario, the front surface of integrated circuit die 101 is pressed down onto package substrate 102 such that each conductive pillar is directly attached to its corresponding conductive pad (e.g., conductive pillar 103A to conductive pad 104A and conductive pillar 103B to conductive pad 104B). It should be appreciated that each of the conductive pillars may have at least a flat surface that faces a substantially flat top surface of the corresponding conductive pad. As such, the conductive pillars may securely couple to the corresponding conductive pads in order to form reliable electrical coupling. Additionally, the thermal compression process may cause non-conductive material 107 to flow (i.e., squeeze flow) through the gap between integrated circuit die 101 and package substrate 102 to further strengthen the attachment between integrated circuit die 101 and package substrate 102.

Figure 2:
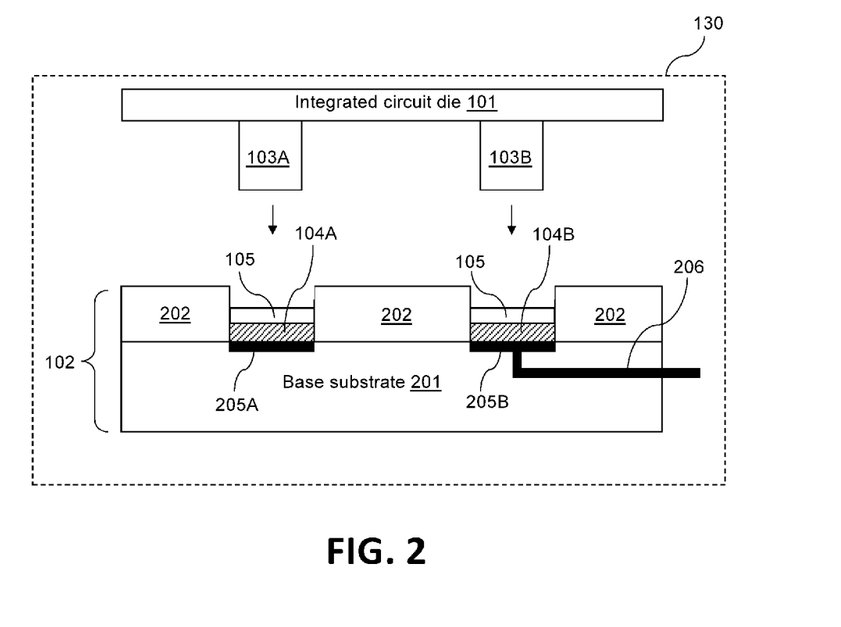
FIG. 2 shows a cross-sectional side view of a portion of the integrated circuit package shown in FIG. 1 in accordance with one embodiment of the present invention.

FIG. 2 shows a cross-sectional side view of region 130 of integrated circuit package 100 shown in FIG. 1, in accordance with one embodiment of the present invention. As shown in FIG. 2, package substrate 102 may have two different layers, namely a base substrate layer (e.g., base substrate 201) and a solder mask layer (e.g., solder mask layer 202). The base substrate layer may be an organic substrate. In one embodiment, the base substrate layer may include one or more conductive traces, such as conductive traces 205A, 205B, and 206 for signal routing purposes. The solder mask layer 202 (also referred to as a solder resist layer) is generally applied over the base substrate to protect and insulate the conductive traces in the base substrate against oxidation.

Accordingly, package substrate 102 may also include conductive pads 104A and 104B. In one embodiment, conductive pads 104A and 104B are formed on a surface of package substrate 102. During the formation of conductive pads 104A and 104B, openings are formed on solder mask layer 202 to expose a portion of conductive pathways (e.g., conductive traces 205A and 205B) in base substrate 201, using photolithography process. A conductive material, such as copper, may be deposited in each of the openings to form conductive pads 104A and 104B. Accordingly, a protective layer (e.g., protective layer 105) may be applied on the exposed surfaces of conductive pads 104A and 104B to protect and insulate the conductive pads from oxidation.

With the increasing demands for high density integrated circuit packages, a solderless attachment method may be used in the fabrication of such packages to address the need for compact logic density. For example, as shown in FIG. 2, integrated circuit 101 may form an electrical connection with package substrate 102 via direct coupling of conductive pillars 103A and 103B to their respective conductive pads 104A and 104B. Such a configuration is conducted without any intervening solder, which eliminates or reduces the risk of solder shorting between the conductive pillars. As such, the conductive pillars can be placed close to each other at very fine pitch (e.g., about 10 micrometers).

Additionally, direct coupling of the conductive pillars 103A and 103B to the respective conductive pads 104A and 104B may connect integrated circuit die 101 to package substrate 102, as well as to other circuitries (not shown) in integrated circuit package 100 of FIG. 1. For example, as shown in FIG. 2, conductive traces 205A and 205B may be used as conductive pathways to route signals between integrated circuit die 101 and package substrate 102. Accordingly, conductive trace 206 may form a conductive pathway to route signals between integrated circuit die 101 to other circuitries in integrated circuit package 100.

Figure 3:
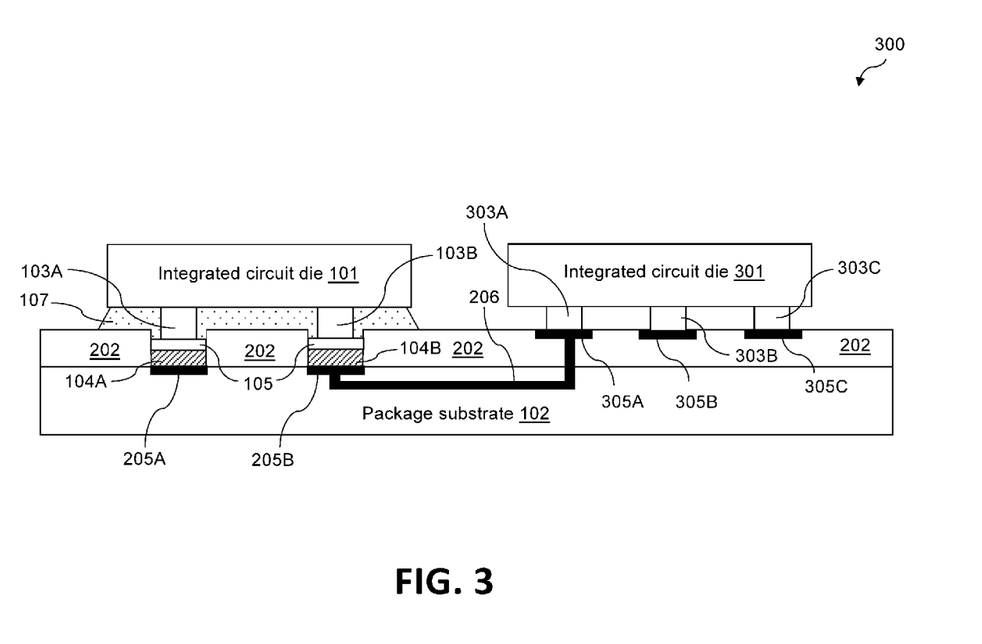
FIG. 3 shows a cross-sectional side view of an illustrative integrated circuit package having two integrated circuit dies in accordance with one embodiment of the present invention.

The present invention may also be implemented in different integrated circuit package configurations. FIG. 3 shows a cross-sectional side view of illustrative integrated circuit package 300, in accordance with one embodiment of the present invention. It should be appreciated that integrated circuit package 300 may share similar elements with integrated circuit package 100 of FIG. 1. As such, for the sake of brevity, structures and elements that have been described above, such as integrated circuit die 101, package substrate 102, conductive pads 104A and 104B, protective layer 105, and non-conductive material 107, will not be described in detail.

As shown in FIG. 3, integrated circuit package 300 includes two integrated circuit dies (e.g., integrated circuit dies 101 and 301) that are placed adjacent to each other on package substrate 102. Integrated circuit die 101 may have one or more conductive pillars (e.g., conductive pillars 104A and 104B). Similarly, integrated circuit die 301 may have one or more conductive pillars (e.g., conductive pillars 303A, 303B, and 303C). It should be appreciated that even though two integrated circuit dies are shown in the embodiment of FIG. 3, any number of integrated circuit dies may be employed in this context. It should also be appreciated that integrated circuit die 301 may be fabricated on package substrate 102 in a similar manner as integrated circuit 101. As such, the structure of integrated circuit 301 will not be shown and described in detail, for the sake of brevity.

Package substrate 102 may include one or more interconnect pathways for electrical connection to other integrated circuit dies. Each of the interconnect pathways may be a conductive trace (e.g., conductive traces 205B, 206, and 305A). As shown in FIG. 3, conductive traces 205B, 206, and 305A may form an intra-package chip-to-chip connection for signal transmissions between integrated circuit die 101 and integrated circuit die 301. As an example, input-output (IO) signals from integrated circuit die 101 can be routed to integrated circuit die 301 via the chip-to-chip connection.

Accordingly, conductive trace 205A may form a chip-to-package connection between integrated circuit die 101 and package substrate 102, and conductive traces 305B and 305C may form chip-to-package connection between integrated circuit die 301 and package substrate 102.

In a conventional multichip package, an interposer with through-silicon vias (TSVs) is used to electrically connect two or more integrated circuit dies to a package substrate. However, such a package is limited by the interposer fabrication process, which is typically expensive and requires significant design effort. Therefore, a solderless die-to-substrate attachment is required to electrically connect integrated circuit dies to the package substrate in an integrated circuit package. For example, as shown in FIG. 3, integrated circuit die 101 of integrated circuit package 300 may form electrical connections with package substrate 102 via direct coupling of conductive pillars 103A and 103B to their respective conductive pads 104A and 104B. Such a configuration is conducted without any intervening solder, which eliminates or reduces the risk of solder shorting between the conductive pillars. In this context, the interposer is no longer needed to electrically connect the integrated circuit dies to the package substrate and hence, a reduction in fabrication cost can be achieved.

Figure 4:
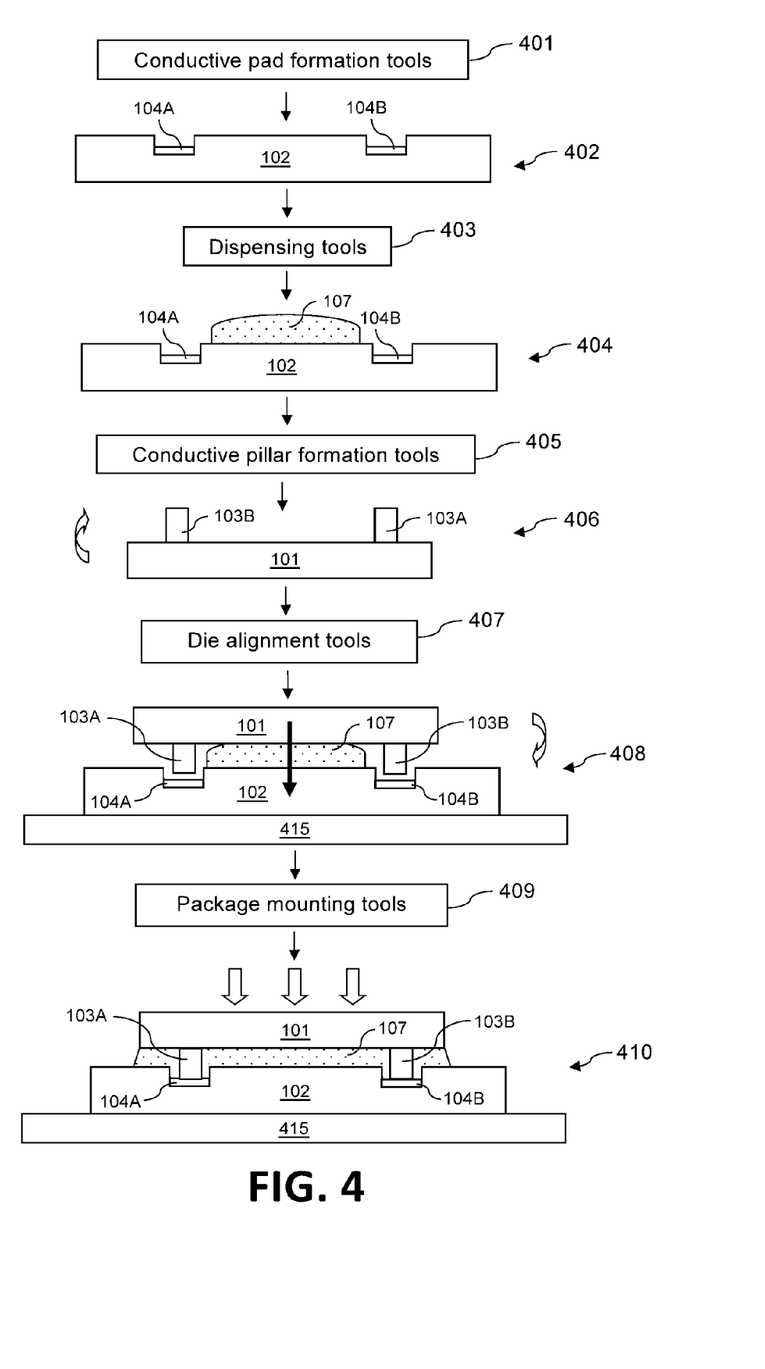
FIG. 4 is a flow diagram of an illustrative manufacturing process for packaging an integrated circuit die in accordance with an embodiment of the present invention.

FIG. 4 is a flow diagram of an illustrative manufacturing process for packaging an integrated circuit die, in accordance with an embodiment of the present invention. As shown in step 402, conductive pads 104A and 104B may be formed on package substrate 102 using conductive pad formation tools 401. Conductive pads 104A and 104B may be formed by forming openings on a surface of package substrate 102. A conductive material, such as copper, is deposited in each of the opening to form conductive pads 104A and 104B.

Prior to die placement, non-conductive material 107 may be deposited on package substrate 102 at step 404. In general, non-conductive material 107 is typically used to fill the gap between the integrated circuit die and package substrate 102 during die attachment, so as to improve bonding between the integrated circuit die and package substrate 102. Tools for dispensing or depositing an non-conductive material on the package such as dispensing tools 403 may be used to deposit non-conductive material 107, such as epoxy.

As shown in step 406, conductive pillars 103A and 103B, such as copper pillars, may be formed on a front surface of integrated circuit die 101. For example, the front surface of integrated circuit die 101 is an active surface in which transistors (not shown) are formed. In order to form one or more conductive pillars on integrated circuit die 101, integrated circuit die 101 may be flipped or turned over such that the front surface (or the active surface) of integrated circuit die 101 faces upwards as shown in step 406. This way, conductive pillars 103A and 103B can be formed on the active surface of integrated circuit die 101. In one embodiment, conductive pillars 103A and 103B may be formed on integrated circuit die 101 using conductive pillar formation tools 405. For example, conductive pillar formation tools 405 may include an electrochemical plating (ECP) tool.

In one embodiment, parallel manufacturing processes may be adopted in integrated circuit packaging. For example, different packaging or fabrication processes such as the fabrication process involving a package substrate (e.g., steps 402 and 404) and the fabrication process involving an integrated circuit die (e.g., step 406) may be performed in parallel, or in a different order, to save time and cost.

Integrated circuit die 101, as shown in step 406, may be flipped over such that conductive pillars 103A and 103B on integrated circuit die 101 are facing conductive pads 103A and 104B on package substrate 102 at step 408. In one embodiment, integrated circuit die 101 is aligned such that each of the conductive pillars is aligned to a corresponding conductive pad on the package substrate, which is placed on a bonding stage (e.g., bonding stage 415). As shown in step 408, integrated circuit die 101 may be aligned using die alignment tools 407.

At step 410, integrated circuit die 101 is attached to package substrate 102. In this step, integrated circuit die 101 may be attached to package substrate 102 in a flip-chip configuration, where the front surface (e.g., active surface) of integrated circuit die 101 is presented against package substrate 102. Each of the aligned conductive pillars is then physically contacted to the corresponding conductive pads on package substrate 102, by applying heat and pressure onto the back surface (e.g., the inactive surface) of integrated circuit die 101, using package mounting tools 409. For example, package mounting tools 409 may include a bonding tool (not shown) that applies heat and pressure to facilitate the attachment of integrated circuit die 101 to package substrate 102. In one embodiment, bonding stage 415 may be preheated (e.g., preheated to 80 degrees Celsius (° C.)) to heat package substrate 102, for the purpose of assisting the die attachment procedure.

Figure 5:
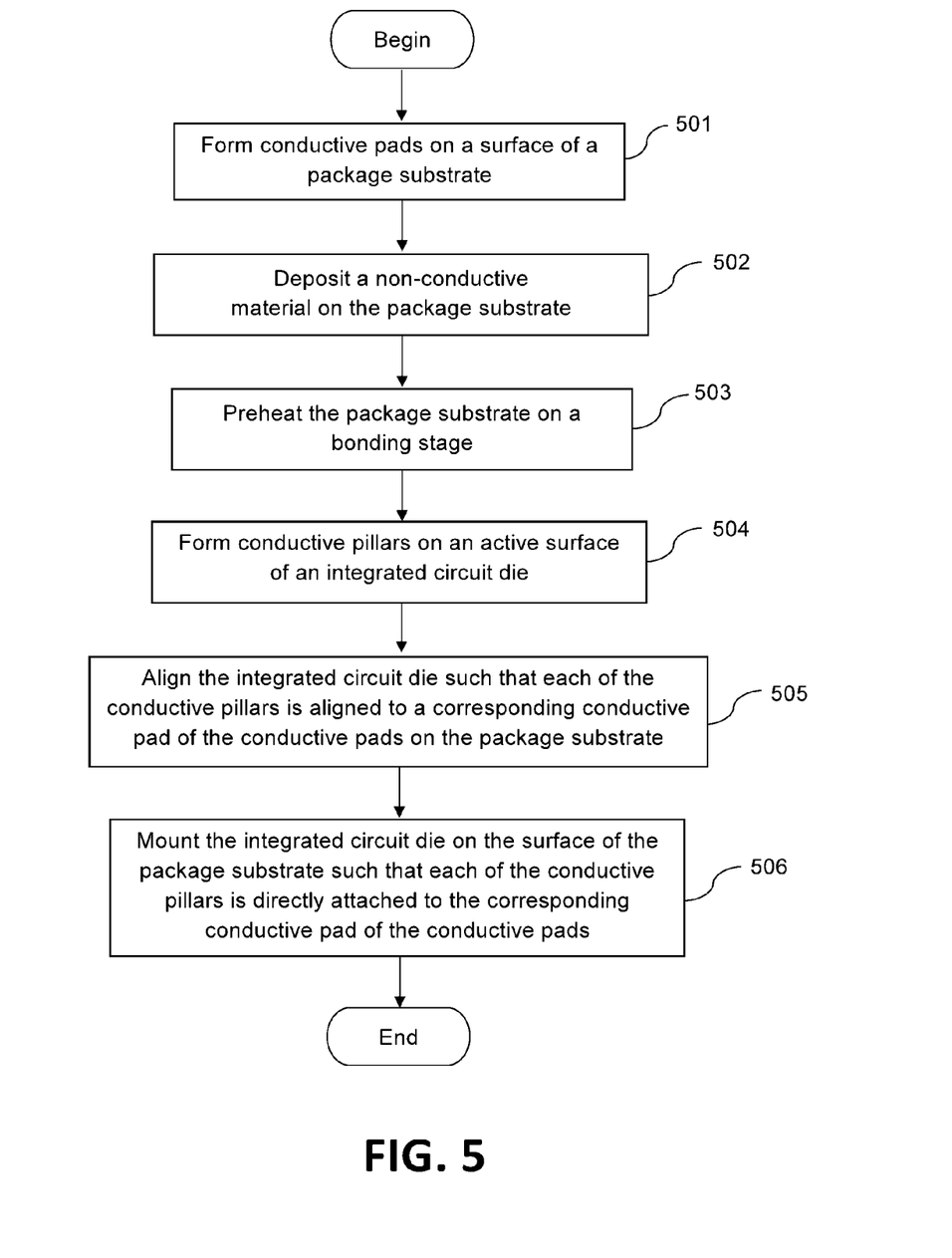
FIG. 5 is a flowchart of illustrative steps for fabricating an integrated circuit package in accordance with an embodiment of the present invention.

FIG. 5 is a flowchart of illustrative steps for fabricating an integrated circuit package, in accordance with an embodiment of the present invention. It should be appreciated that the embodiments of FIGS. 1 and 4 may be used as examples to illustrate the steps described below. At step 501, conductive pads are formed on a surface of a package substrate. In one embodiment, the conductive pads may be formed by depositing copper or other conductive materials to form contacts on the surface of the package substrate. To prevent the conductive pads from being oxidized, the exposed surfaces of the conductive pads are covered with a protective layer (e.g., protective layer 105 of FIGS. 1 and 2) to insulate the conductive pads from oxidation. As an example, the protective layer is an organic solderability preservative (OSP) material.

At step 502, a non-conductive material is deposited on the package substrate. As shown in FIG. 1, non-conductive material 107 may be dispensed on the surface of package substrate 102 prior to die placement.

At step 503, the package substrate is preheated on a bonding stage. In one embodiment, the bonding stage (e.g., bonding stage 415 of FIG. 4) may have a heating element that heats the stage at a preheated temperature, which is approximately 80° C. The preheated bonding stage may heat the package substrate to the same preheated temperature when the package substrate is placed on the bonding stage.

At step 504, conductive pillars are formed on an active surface of an integrated circuit die. Generally, a conductive pillar may be formed by a wafer level bumping process that comprises seed layer sputtering, resist coating, seed layer plating, resist striping, seed layer etching, and solder reflow. In practice, one or more steps involving the same integrated components may be combined with other steps, performed in any suitable order, performed in parallel (e.g., simultaneously or substantially simultaneously), or removed. For example, steps 501, 502, and 503 involve a package substrate and these steps may be combined and performed in parallel with step 504, which involves an integrated circuit die.

At step 505, the integrated circuit die is aligned such that each of the conductive pillars is aligned to a corresponding conductive pad of the conductive pads on the package substrate. For example, as shown in FIG. 2, each of the conductive pillars (e.g., conductive pillars 103A and 103B) are aligned to a respective corresponding conductive pad (e.g., conductive pads 104A and 104B) such that they form a vertical interconnect structure in the integrated circuit package.

At step 506, the integrated circuit die is mounted on the surface of the package substrate via thermal compression. In this scenario, the integrated circuit die is pressed down onto the preheated package substrate at a specific pressure (e.g., about 300 mega Pascal) and temperature (e.g, about 180° C.) so that each of the aligned conductive pillars directly connects to its corresponding conductive pad. It should be noted that, in one embodiment, no solder is used to attach the conductive pillars to the conductive pads. As such, a high-density interconnection structure may be achieved as solder bridging is does not occur in the solderless process. Hence, the conductive pillars can be placed close to each other at very fine pitch (e.g., about 10 micrometers). Additionally, the mounting of the integrated circuit die onto the package substrate also causes the non-conductive material to flow (i.e., squeeze flow) through the gap between integrated circuit die and the package substrate. The non-conductive material may thus reinforce the physical and mechanical properties of the conductive pillars between the integrated circuit die and the package substrate.

The method and apparatus described herein may be incorporated into any suitable circuit. For example, the method and apparatus may be incorporated into numerous types of devices such as microprocessors or other integrated circuits. Exemplary integrated circuits include programmable array logic (PAL), programmable logic arrays (PLAs), field programmable logic arrays (FPGAs), electrically programmable logic devices (EPLDs), electrically erasable programmable logic devices (EEPLDs), logic cell arrays (LCAs), field programmable gate arrays (FPGAs), application specific standard products (ASSPs), application specific integrated circuits (ASICs), and microprocessors, just to name a few.

Although the method operations were described in a specific order, it should be understood that other operations may be performed in between described operations, described operations may be adjusted so that they occur at slightly different times or described operations may be distributed in a system which allows the occurrence of the processing operations at various intervals associated with the processing, as long as the processing of the overlay operations are performed in a desired way.

The foregoing is merely illustrative of the principles of this invention and various modifications can be made by those skilled in the art without departing from the scope and spirit of the invention.

What is claimed is:

1. An integrated circuit package, comprising:
    a package substrate having a surface, the package substrate having a plurality of conductive pads at the surface of the package substrate;
    a solder mask layer that is formed on the surface of the package substrate over the plurality of conductive pads;
    an integrated circuit die having front and back surfaces, wherein the integrated circuit die is mounted on the package substrate, and wherein the front surface of the integrated circuit die faces the package substrate;
    a plurality of conductive pillars formed on the front surface of the integrated circuit die, each of which makes direct physical contact with a corresponding conductive pad in the plurality of conductive pads without any intervening solder;
    a plurality of interconnect pathways in the package substrate, each of which is coupled to a corresponding conductive pad in the plurality of conductive pads;
    an additional integrated circuit die that is mounted on the package substrate and that is coupled to the integrated circuit die through the plurality of interconnect pathways; and
    an additional plurality of conductive pads formed at a top surface of the solder mask layer, wherein the additional integrated circuit die is mounted directly on the additional plurality of conductive pads.

2. The integrated circuit package defined in claim 1, wherein the plurality of interconnect pathways comprises conductive traces.

3. The integrated circuit package defined in claim 1, wherein the package substrate comprises an organic substrate.

4. The integrated circuit package defined in claim 1, wherein each conductive pillar in the plurality of conductive pillars is positioned in an area adjacent to the corresponding conductive pad in the plurality of conductive pads.

* * * * *